United States Patent [19]

Yamamoto et al.

[11] Patent Number: 5,234,150
[45] Date of Patent: Aug. 10, 1993

[54] METHOD OF MANUFACTURING SPOTWISE PARTIAL CLAD MATERIAL

[75] Inventors: Kazuhiro Yamamoto; Shin Nemoto; Jun Okamoto; Susumu Okazaki, all of Suita, Japan

[73] Assignee: Sumitomo Special Metal Co., Osaka, Japan

[21] Appl. No.: 582,844

[22] PCT Filed: Sep. 19, 1990

[86] PCT No.: PCT/JP90/01195
§ 371 Date: Oct. 11, 1990
§ 102(e) Date: Oct. 11, 1990

[87] PCT Pub. No.: WO91/04123
PCT Pub. Date: Apr. 4, 1991

[30] Foreign Application Priority Data

Sep. 20, 1989 [JP] Japan ................ 1-246165

[51] Int. Cl.$^5$ .............................................. B23K 20/00
[52] U.S. Cl. ..................... 228/158; 228/102; 228/170
[58] Field of Search ............ 228/158, 102, 170, 177, 228/13, 8, 9, 235

[56] References Cited

U.S. PATENT DOCUMENTS 4,887,343 12/1989 Ohishi ................. 228/158

FOREIGN PATENT DOCUMENTS

| 59-141389 | 8/1984 | Japan . |  |
| 0174287 | 10/1984 | Japan | 228/158 |
| 0209787 | 9/1986 | Japan | 228/102 |
| 0209788 | 9/1986 | Japan | 228/158 |
| 62-114781 | 5/1987 | Japan . |  |
| 0068284 | 3/1988 | Japan | 228/158 |

Primary Examiner—Mark Rosenbaum
Assistant Examiner—James Miner

[57] ABSTRACT

The present invention relates to a method of efficiently manufacturing a spotwise partial clad material, which is used for a lead frame of a semiconductor integrated circuit such as a flat package. According to the method, a substrate material to which metal foil pieces having a determined size have been tacked at a highly accurate pitch is prepared by continuously pre-tacking a metal foil as fed at a constant feeding rate to a substrate material as fed also at a constant feeding rate at determined intervals by spot-welding by any of resistance welding, ultrasonic welding or laser welding or thereafter cutting and removing the unnecessary parts by laser-cutting or by the use of rotary cutters, or alternatively, it is prepared by cutting a metal foil as fed at a constant feeding rate with a punch with simultaneously tacking the resulting metal foil piece to a substrate material as fed also at a constant feeding rate by spot-welding of using the punch as an electroconductive material part. The obtained metal-tacked substrate material is pressure-welded and rolled, whereupon the intended and determined thickness of the rolled material is ensured by cascade control for load-constant control and elongation percentage-constant control and the intended load in rolling is controlled by detecting the intended position from the pitch of the rolled material and the intended standard point of the non-rolled material.

11 Claims, 11 Drawing Sheets

FIG.4
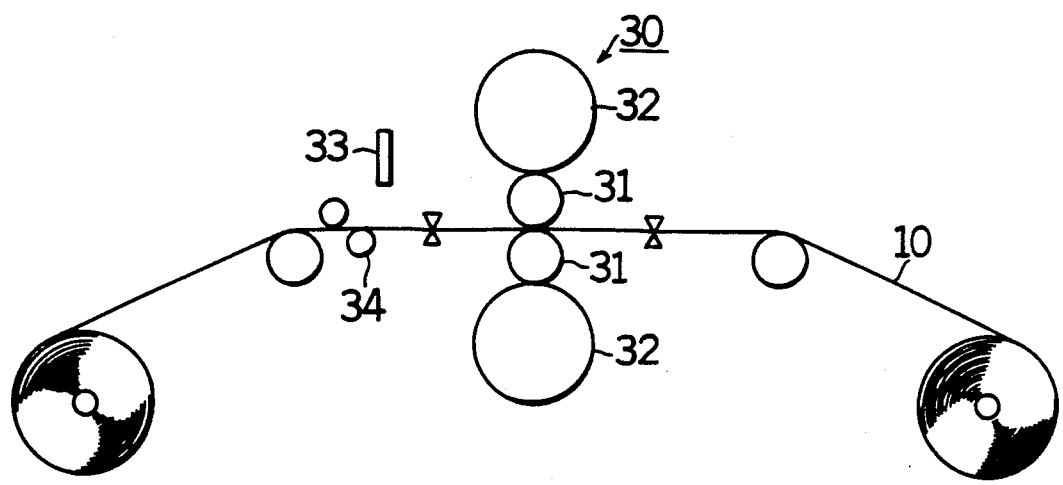
FIG.5a  FIG.5b  FIG.5c
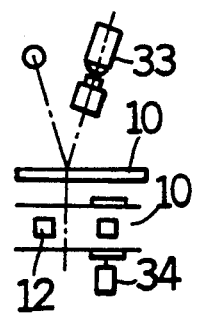 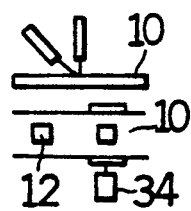 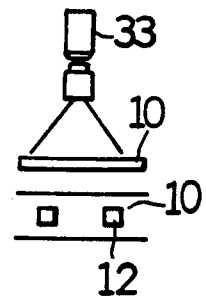

METHOD OF MANUFACTURING SPOTWISE PARTIAL CLAD MATERIAL

TECHNICAL FIELD

The present invention relates to a method of manufacturing a clad material to be used for a lead frame of a semiconductor integrated circuit such as a flat package, and in particular it relates to a method of manufacturing a spotwise partial clad material composed of a metal substrate material such as and Fe-Ni alloy or the like and metal foil pieces of a brazing material, Al, Cu or the like, each having a determined size, the metal foil pieces being pressure-welded on the substrate material at determined intervals.

BACKGROUND ART

Recently, it has become increasingly desirable to make devices having semiconductor integrated circuits small in size, and flat packages have become frequently used in such integrated circuits.

As a lead frame for a flat package, for example, a construction as shown in FIG. 2 is known. In particular, the lead frame (3) which is to be provided with terminal parts on all four edges thereof needs to have metal-coated parts for improving the weldability, for example, as coated with a metal of Ag-brazing material, Al, Cu or the like, on the parts to be wire-bonded.

For providing such metal-coated parts, heretofore a lead frame as worked has been subjected to (a) a vapour-deposition method or (b) a plating method. However, a method having a higher producibility is desired because the noted methods have some drawbacks. In particular, in accordance with the vapour-deposition method (a), not only expensive plants are necessary but also the parts which are not to be coated with metals need to be masked. Therefore, the vapour-deposition speed is slow and the producibility is low. On the other hand, in accordance with the plating method (b), metals usable in the method are limited as some metals cannot be plated, and the thickness of the metal layer to be efficiently plated is also limited.

In order to previously provide the metal-coated parts, there is a method of spotwise applying the metal-coated parts (2) onto the lead frame material (1) with high accuracy, as shown in FIG. 1, followed by press-working or etching the spotwise metal-coated material.

For instance, a technique in which an Al or Ag foil is stripewise provided on a lead frame-forming strip material by pressure-welding or rolling and thereafter the unnecessary parts are removed mechanically or chemically so as to form the desired metal foil-coated spots on the strip material has been proposed (Japanese Patent Publication No. 59-1078). However, in accordance with the proposed technique, the yield of the coated metal is poor, the working efficiency is low as the necessary parts to be metal-coated must be masked when removing the unnecessary parts, and provision of the desired metal foil-coated spots, each having the desired size, at a desired pitch with high accuracy is difficult.

Although it is possible to lap metal foil pieces, each having a determined size, over a substrate material having a determined extremely short length at the determined positions to form a spotwise partial clad material having a determined length by pressure-welding or rolling, it is impossible to cut a metal foil to be coated into pieces, each having a determined size and a determined length, with high accuracy so as to attach the thus-cut metal foil pieces to a continuous long substrate material strip as unwound from a coil of the strip, with highly accurately adjusting the positions of the substrate material strip to be coated with the metal foil pieces, thereby to continuously tack the pieces on the strip at a determined pitch. For this reason, it is said that industrial mass-production of a spotwise partial clad material is impossible.

On the other hand, formation of a lead frame by tacking Al foil pieces on a lead frame material by spot-welding followed by cladding the pieces-tacked material has been proposed (Japanese Patent Publication No. 60-227456). However, the method of highly accurately adjusting the positions of the lead frame material to be coated with the metal pieces at a determined pitch for continuously tacking the pieces on the material is not concretely illustrated-, and therefore the proposed technique is not adaptable to practical use.

Additionally, the proposed technique would have another problem on the rollability of the Al-coated material, since the Al foil pieces as tacked by mere spot-welding are unmovably fixed at the welded parts.

Furthermore, the proposed technique would have still another problem in that the necessary pitch accuracy and dimension accuracy could not be achieved, since the pitch would fluctuate even by extremely slight variation of the rolling pressure in pressure-welding and rolling.

In view of the current situations mentioned above, the object of the present invention is to provide a method of manufacturing a spotwise partial clad material where metal foil pieces, each having a determined size, are clad on a substrate material at a determined pitch with high accuracy.

Another object of the present invention is to provide a method of manufacturing a spotwise partial clad material where a metal foil strip is cut into pieces having a determined size and a determined length with high accuracy, the pieces are continuously tacked onto a lead frame material by accurately adjusting the positions to be tacked, and thereafter the material as tacked with the metal foil pieces is pressure-welded or rolled to form a metal foil pieces-clad material, whereupon the pitch of the metal foil pieces as clad on the substrate material by rolling is highly accurate.

Still another object of the present invention is to provide a method of manufacturing a spotwise partial clad material where a metal foil strip is continuously tacked onto a lead frame material by accurately adjusting the positions to be tacked, the unnecessary parts of the tacked metal foil strip are cut and removed to thereby spotwise arrange the metal foil strip on the substrate material before rolling, and thereafter the metal foil pieces-tacked are pressure-welded and rolled to finally efficiently give a metal foil pieces-clad material, whereupon the metal foil pieces are clad on the material with high accuracy after rolling.

DESCRIPTION OF THE INVENTION

The present invention involves a method of manufacturing a spotwise partial clad material comprising a step of spotwise tacking metal foil pieces, each having a determined size, on a substrate strip at a determined interadjacent pitch by spot-welding at one or more spots to prepare a metal-tacked material to be rolled, and a step of pressure-welding and rolling the noted material; the method being characterized in that the step of pressure-welding and rolling the metal-tacked material is associated with a means of determining the intended rolling load for obtaining the intended pitch and the intended thickness of the material as rolled, on the basis of the size of the substrate and the size of the metal foil pieces of the tacked material and of the pitch of the metal foil pieces on the material, to thereby constantly control the rolling practical load on the basis of the intended rolling load, and a means of correcting and controlling the practical rolling load during continuous rolling in accordance with the difference between the intended position of a metal foil piece as separated from a previously determined initial point on the substrate via a determined number of other metal foil pieces therebetween and the position of the same metal foil piece as actually measured, which is to be obtained by measurement of the position of the metal foil pieces on the rolled material.

In the present invention, various means may be employed in the step of preparing the material to be rolled, as mentioned below.

As one embodiment, a metal foil and a substrate material, each of which is fed at a constant rate, are continuously tacked to each other at determined intervals by continuous laser-welding, and thereafter the unnecessary parts are cut and removed by laser-cutting, whereby the metal foil pieces, each having a determined size, are tacked to the substrate material at a highly accurate pitch.

As another embodiment, a metal foil fed at a constant rate is pressed on a substrate material fed also at a constant rate by the use of a presser tool, whereupon the foil pieces are tacked to the material by laser-cutting and laser-welding to obtain a metal tacked material.

As still another embodiment, a metal foil and a substrate material, each of which is fed at a constant rate, are tacked to each other by continuous spot-welding at determined intervals and thereafter the unnecessary parts are cut and removed by the use of a rotary cutter.

As still another embodiment, a metal foil fed at a constant rate is cut by punching with a punch and is at the same time tacked to a substrate material fed also at a constant rate by spot-welding, using the punch as an electroconductive material, to thereby obtain a material to which metal foil pieces each having a determined size, have been tacked at a highly accurate pitch.

Afterwards, the thus metal-tacked substrate material is pressure-welded and rolled, the rolling load controlled so that the rolled material has a determined thickness. For instance, cascade control is effected by combination of load-constant control and elongation percentage-constant control, or the pitch of the rolled material is detected to control the intended load, whereby the thickness of the rolled material is controlled with ultra-high accuracy. Accordingly, a spot-wise partial clad having a highly accurate pitch and a highly accurate size can be obtained by the method of the present invention.

More precisely, one embodiment of the process of preparing a material to be rolled by the present invention comprises the following steps (1) to (5) in order:

(1) a metal foil is lapped on a substrate material, while the two are fed at a constant rate;

(2) the two are put between a welding tool on the surface of the metal foil and the support or the like on the back surface of the substrate material and are laser-welded to each other by irradiation of a laser thereto through a laser-irradiating window as provided in the welding tool, whereupon the metal foil having a determined width is lapped on the substrate material at a determined position and the former is tacked to the latter at the lengthwise edges of the metal foil pieces at regular intervals in the lengthwise direction of the substrate material, by the noted constant feeding and the subsequent laser-welding;

(3) the metal foil is cut at regular intervals in the crosswise direction, for example, by the use of a pair of laser cutters held at regular intervals; and (4) after cutting, the parts not welded are removed; and (5) the above-mentioned process is repeated so that the metal foil pieces, each having a determined size, are continuously tacked to the substrate material at a determined pitch.

Another embodiment of the process of preparing a material to be rolled by the present invention comprises the following steps (1) to (5) in order, using a tool of pressing metal foils, which is to open and shut in accordance with the feeding device of feeding a metal foil onto a substrate material at a determined position at a constant feeding rate, whereby the metal foil may be pressed onto the substrate material, if desired, the presser tool being provided with a laser-irradiating window through which laser rays are irradiated for cutting the metal foil into pieces in the widthwise direction of the substrate material as well as with a laser-irradiating window through which laser rays are irradiated for spot-welding at one or more spots in the widthwise direction of the substrate material:

(1) a metal foil and a substrate material are fed at a constant rate;

(2) after constant-rate feeding, the metal foil is pressed onto the substrate material at a determined position with the presser tool;

(3) the metal foil is laser-cut into pieces, each having a determined size, by irradiating cutting laser rays and welding laser rays at the same time or at determined time intervals to the foil, whereupon the resulting metal foil pieces are tacked to the substrate material by laser-welding at one or more points of the edges in the widthwise direction or lengthwise direction of the substrate material; and (4) accordingly, the metal foil pieces, each having a determined size, are lapped and tacked onto the substrate material at the determined position by the laser-cutting and laser-welding, and thereafter the thus metal-tacked substrate is fed in a determined length; and (5) the above-mentioned process is repeated so that the metal foil pieces, each having a determined size, are continuously tacked to the substrate material at a determined pitch.

In carrying out the method of the present invention, known means and apparatus may be employed for the laser-cutting and laser-welding. For instance, laser rays of various wavelength ranges of ruby, Nd-YAG or C02, those to be generated by various Q-switchwise, pulsewise or continuous generating types, or those of various powers can properly be selected and used for cutting or welding purpose. If desired, one laser device may be used for both cutting and welding purposes by properly changing the function of the device.

The laser-irradiating method to be effected for laser-cutting or laser-welding needs to be properly determined in accordance with the time of cutting or welding the metal foil strip and other conditions during the process. For instance, laser rays are irradiated on the necessary part of the metal foil strip by providing a laser-irradiating device on the presser tool to be used for pressing the metal foil strip to the substrate material; or alternatively laser rays are irradiated on the edges of the metal foil strip from a separate laser-irradiating device or are irradiated on the necessary part of the metal foil strip through an irradiating window or slit part in the presser tool used for pressing the metal foil strip.

Where a long continuous metal foil strip is welded, it is recommended that the metal foil strip be slit and the both edges of the thus slit piece are welded by laser-irradiation at a determined interval. On the other hand, where cut and short metal foil pieces are welded, it is recommended that either the cut edges or the both edges of the pieces slit as mentioned above are welded by laser-irradiation at a determined interval.

As the welding atmosphere for carrying out the invention, an inert gas atmosphere is preferred. For instance, an inert gas is jetted to the welding system or the welding step may be effected by laser-welding in a closed inert gas chamber, in accordance with necessity.

As fluctuation of the pitch of the metal foil pieces in the step of pressure-welding and rolling the metal-tacked substrate material is caused by (a) variation of the thickness of the substrate material and (b) variation of the roll gap (thickness) of the offset type roll of the rolling machine, ultra-high accurate thickness control by using both feed-back system and feed-forward system is necessary.

In accordance with the method of the present invention, the variation of the width of the material as pressure-welded and rolled is far smaller than the variation of the thickness thereof, and the former may be considered to be constant. Accordingly, by constantly controlling the reduction ratio (Re), control of the pitch may well be effected.

$$V = L_0 h_0 b = L_1 h_1$$

$$L_0 = L_1 h_1 / h_0 ]_{L_1} Re$$

In the formulae, V is a volume; $h_1$ is a thickness of the original (non-rolled) material; $h_0$ is a thickness of the rolled material; b is a width of the material; $L_1$ is a pitch of the original material; and $L_0$ is a pitch of the rolled material.

On the other hand, the rolling load P is represented by the following formula:

$$P = k_m \sqrt{(R(h_1 - h_0))bQ_P}$$

$$= k_m \sqrt{(R(1/Re - 1)h_0)bQ_P}$$

$$= k_m \sqrt{(R(L_0/L_1 - 1)h_0)bQ_P}$$

where $k_m$ is a deformation resistance; R is a radius of the roll in consideration of the flatness of the roll; and $Q_P$ is a function of the rolling pressure Therefore, control of the pitch is possible by controlling the intended rolling load. However, as the rolling pressure function $Q_P$ varies in accordance with the friction condition and others, it needs to be corrected.

In order to satisfy the requirement, a pitch-measuring device is provided at the outlet of the rolling machine to be used in carrying out the method of the present invention, and accordingly, the total correction including the correction of the rolling pressure function $Q_P$ during continuous rolling is fed back to the system of controlling the rolling load so that the ultra-high accurate controlling of the thickness of the rolled material has become possible and the intended pitch control has thereby become realized by the present invention.

Additionally, a pitch-measuring device for measuring the pitch of the metal foil pieces on the substrate material is provided at the inlet of the rolling machine to be used in carrying out the method of the present invention, and accordingly, the value of the pitch as measured before rolling is fed forward to the system so that the intended and determined value is corrected continuously or intermittently and the ultra-high accurate controlling of the thickness of the rolled material is also possible at a high speed.

In order to further increase the accuracy in the control system to be operated by measurement of the pitch, the present invention uses a position-detecting means for measuring the position of the metal foil, as provided at the outlet of the rolling machine, and accordingly, the total correction including the correction of the rolling pressure function $Q_P$ during continuous rolling is fed back to the controlling system for controlling the rolling load, in accordance with the difference between the intended position of the determined metal foil piece as separated from the determined initial point and the actual measured position, whereby the ultra-high accurate controlling of the thickness of the rolled material has become possible and also the ultra-high accurate controlling of the intended position of the metal foil pieces has become realized by the present invention.

Additionally, for determining the above-mentioned intended rolling load, a position-detecting means for measuring the position of the metal foil pieces is provided at the inlet of the rolling machine so that the difference between the intended position of the metal foil piece before rolling and the actual measured position thereof is determined and the thus determined value is fed forward to the system, whereby the intended load-determined value is corrected continuously or intermittently and the ultra-high accurate controlling of the thickness of the rolled material is also possible at a high speed.

If desired, the control to be effected by measurement of the position of the determined metal foil piece as separated from the determined initial position may be combined with the control to be effected by measurement of the pitch, or the former may be used for correcting the pitch.

In accordance with the present invention, various external influences such as (a) periodic fluctuation to be caused by the deflected roll of the offset type rolling machine and (b) gentle fluctuation caused by variation of the amount of the oily film applied to the material being worked may be reduced, during pressure-welding and rolling of the substrate material to which metal foil pieces have been tacked at a determined pitch. As a result, the ultra-high accurate pitch-control is possible in carrying out the method of the invention, which therefore provides a spotwise partial clad material capable of being used in forming lead frames by press-working or etching, with an elevated producibility.

As the substrate material which is to be a mother material to be clad with metal foil pieces thereon in the present invention, any and every material which has heretofore been known useful as a lead frame material, for example, Ni, 42Ni-Fe alloy, Cu, Cu-base alloys and others may be used. As the metal foil to be spotwise pressure-welded to the substrate material, any known brazing material, such as Ag, Ag-Cu or the like ag-brazing material, as well as other metals of Al, Cu or the like may be used.

BRIEF DESCRIPTION OF THE DRAWINGS

FIG. 4 is a schematic side view of a rolling machine, which indicates the pressure-welding and rolling process of the present invention.

FIGS. 5a, 5b and 5c are schematic side views of various pitch-measuring devices.

FIG. 6a being a schematic cross sectional view as seen from the direction of the flow line.

FIG. 7a is an explanatory view as seen from the direction of the flow line.

BEST MODES OF CARRYING OUT THE INVENTION

EXAMPLE 1

First, the step of obtaining a metal-tacked material to be rolled, which is shown in FIGS. 3a to 3d, will be explained below.

A substrate material (10) as unwound from a coil is fed out to the presser tool (15) by a determined length by the use of a constant-feeding device (not shown), while a metal foil (11) as unwound from a coil is analogously fed out onto the material (10) by a determined length, also by the use of a constant-feeding device (not shown).

Downstream of the presser tool (15), a laser-cutting device (16) is provided. The metal-tacked substrate is coiled up after welding, or alternatively, it is pressure-welded and rolled in a rolling device which is provided further downstream.

Though not shown, the constant-feeding device for constantly feeding the substrate material (10) and the metal foil (11) may use any known apparatus which may feed them by a determined length.

Figure 3A:
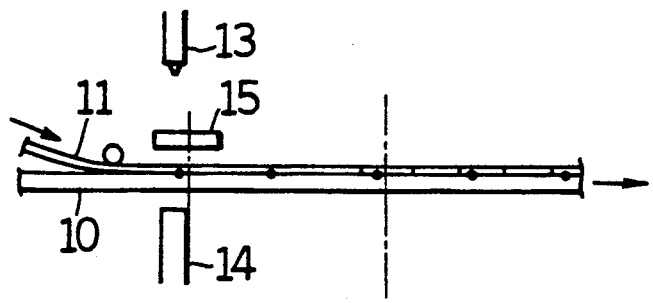
FIGS. 3a, 3b and 3d are schematic side views of a step of manufacturing a metal-tacked material to be rolled.
Figure 3B:
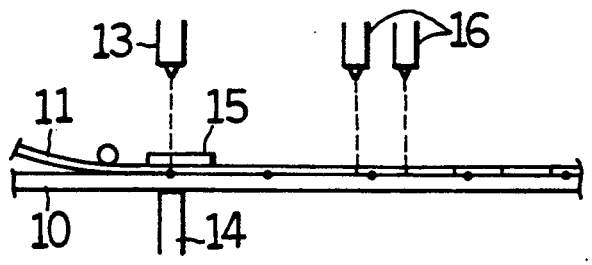
Figure 3C:
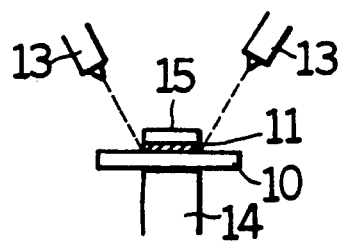
FIG. 3c is a schematic cross sectional view showing a laser-welding device and a laser-cutting device form the direction of the flow line.

The process uses a pair of laser-welding devices (13) (13), as shown in FIGS. 3b and 3c, which are arranged above the presser tool (15) that presses downwardly on the metal foil (11) from the upside thereof. The laser welding devices emit keys towards both widthwise edges of the metal foil (11). Additionally, a supporting part (14), which is movable upwards and downwards, is arranged on the side of the substrate material (10) opposite the front surface to which the metal foil (11) is to be pressure-welded, i.e., the part (14) is arranged at the center part of the back surface of the substrate (10).

Accordingly, the supporting part (14) and the presser tool (15) may be opened and shut in accordance with a feeding device provided with a mechanism for guiding the device to a determined position along the substrate material (10), and after the substrate material (10) and the metal foil (11) have been fed at a constant rate and the latter has been put on the former at a determined position, the supporting part (14) and the presser tool (15) are moved to the substrate material (10) and the metal foil (11), whereupon laser rays are irradiated from the laser-welding devices (13)(13) for effecting laser-welding.

The laser-cutting device (16) is composed of laser-irradiating parts arranged above the substrate material (10) at a determined interval therebetween in the direction of the length of the material (10), as shown in FIG. 3b, and it has a function of cutting the metal foil (11) as moved to the device (16) in the widthwise direction thereof.

The process comprises the following steps, as shown in FIGS. 3a to 3d.

(I) The metal foil (11) is fed onto the determined position of the substrate material (10) by means of a guide mechanism, and the substrate material (10) and the metal foil (11) are fed to the laser-welding devices (13)(13) which are opened by the guide mechanism. In the step, the determined feeding amount is to be decided in consideration of the amount to be variable by the following pressure-welding, rolling and finish-rolling. (FIG. 3a is referred to.)

(II) The supporting part (14) is moved upwards. At the point when the presser tool (15) has pressed the metal foil (11) to the substrate material (10), laser beams from the laser-welding devices (13)(13) are irradiated on both lengthwise edges of an metal foil through the irradiating window in the presser tool (15) to complete laser-welding. (FIGS. 3b and 3c are referred to.)

The step is advantageous, since the laser-irradiating time is extremely short and the metal is nowhere melted. Additionally, the surface of the welded metal foil hardly has welded stains.

In order to tack the metal foil piece on the surface of the substrate material, the welding may preferably be carried out to wed the metal foil piece to the substrate material at two points in the widthwise direction of the metal foil piece (as shown in FIG. 3C), the points of which correspond to a leading edge of the metal foil piece in the direction of movement of the substrate, so that a trailing edge of the metal foil piece may be left free, thereby improving the pressure-rolling workability.

(III) The metal foil (11) as fixed on a part of the substrate material (10) at the position separated from the above-mentioned welding device by integer times the determined pitch is cut with the laser cutters (16)(16) arranged with a determined interval therebetween into a determined length to shape the metal foil piece (11). It is recommended that the cutting be effected as shown in FIG. 3b where the part as welded earlier is cut by laser-cutting.

In the step, the length to be cut is to be determined in consideration of the amount to be variable by the following pressure-welding, rolling and finish-rolling.

Figure 3D:
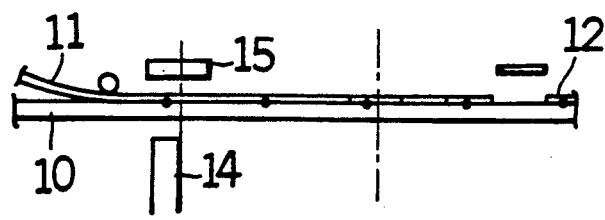

(IV) After being cut, the part not welded is removed, the metal foil piece (12) which has been tacked by laser-welding and which has a good shape and a determined size is obtained. (FIG. 3d is referred to.)

For instance, a cycle of first effecting the step (I) and then simultaneously effecting the steps (II), (III) and (IV) is repeated, to thereby obtain the substrate material (10) on which the metal foil pieces (12) have been continuously tacked at a determined pitch.

Next, the method of pressure-welding and rolling the thus obtained substrate material (10) on which the metal foil pieces (12) have been tacked will be explained below.

FIG. 4 is referred to, where the rolling machine (30) has a pair of work rolls (31)(31) to which a pair of back-up rolls (32)(32) have been applied, and the rewound substrate material (10) is pressed between the rolls. The machine (30) is equipped with a load detector and a thickness-measuring meter, where load-constant control is conducted by a rolling load-controlling device.

Additionally, the rolling machine (30) is equipped with a position-measuring device for measuring the position of the metal foil pieces at the outlet of the machine. In the embodiment, the machine is equipped with an optical sensor (33) and a high-accuracy encoder (34).

The controlling process is composed of the following steps.

(I) On the basis of the measured value of the rolling load and the measured value of the absolute position of the metal foil (as rolled with the rolling load) from the determined initial point, the quantitative relationship between the variation of the rolling load and the variation of the pitch and the absolute position and the control model for the relationship are obtained;

(II) the rolling load to be intended for obtaining the accuracy of the determined position is calculated; and (III) load-constant control is effected, by outputting the calculated rolling load as a control standard.

(IV) The result obtained by measuring the position of the metal foil piece is fed back to the rolling load-controlling device, whereby the control model is appropriately corrected to the control error, so that a total correction is effected.

By the noted control system, ultra-accurate controlling of the thickness of the substrate material in rolling, is possible, so that the intended accurate pitch-control is realized.

In step (II), the measured value of the absolute position of the non-rolled metal foil piece from the determined initial point may be fed forward, if desired, so that the intended determined value of the rolling load may thereby be corrected continuously or intermittently.

The position-measuring device for measuring the position of the metal foilpiece is shown in FIG. 5, where any known sensor such as an optical sensor (33) is used. For instance, the metal foil piece (12) is detected in the direction of the width of the substrate material (10) as shown in FIG. 5a; or the metal foil piece (12) is detected in the direction of the length of the substrate material (10) as shown in FIG. 5c. As another embodiment, an optical sensor (34) and a high-accuracy encoder (34) are used and the position of the metal foil piece (12) from a determined point may be measured, as shown in FIG. 5b.

EXAMPLE 2

First, the step of obtaining a metal-tacked material to be rolled, which is shown in FIGS. 6a to 6e, will be explained below.

The substrate material (10) as unwound from a coil is fed out to the laser-welding device by a determined length by the use of a constant-feeding device (not shown); and a constant-feeding device of feeding a metal foil 11 by a determined length is provided in the vicinity of the material guide (20). The metal foil-feeding device is equipped with detachable mechanism capable of attaching and detaching the metal foil (11) by the use of an absorbing device and the metal foil is fed at a constant rate by a determined length. The thus metal-tacked material is laser-cut and welded and then coiled up, or it is pressure-welded and rolled in a rolling device which is provided in the further downstream of the flow line.

Precisely, in the constant-feeding device for feeding the metal-foil (11) at a constant rate, the metal foil strip (11) having a determined width is adsorbed to the adsorbing device, and the thus adsorbed metal foil (11) is fed out by one stroke of the adsorbing device by sliding over the inner bottom surface of the groove as formed on the material guide (20).

Although the constant-feeding device for feeding the substrate material (10) at a constant rate is not shown, any and every known device which may feed the material (10) by a determined length at a constant rate may be employed.

In the process, a supporting roller (22) is applied to the back surface of the substrate material (10) to which the metal foil piece (11) is to be welded, or that it, the roller (22) is applied to the center part of the lower surface of the material (10), and the presser tool (21) is movable upwards and downwards in accordance with the feeding device as equipped with a mechanism of guiding the tool (21) to a determined position along the substrate material (10). After the substrate material (10) and the metal foil (11) have been fed at a constant rate and the latter has been put on the former at a determined position, the presser tool (21) is moved downwards to be brought into contact with the substrate material (10) and the metal foil (11), whereupon laser rays are irradiated for laser-cutting and laser-welding.

Figure 6A:
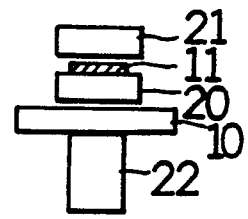
FIGS. 6a to 6e are schematic view of one embodiment of a constant-feeding device, a laser-welding device and a laser-cutting device, and these indicate a flow line of manufacturing a metal-tacked material to be rolled.
Figure 6B:
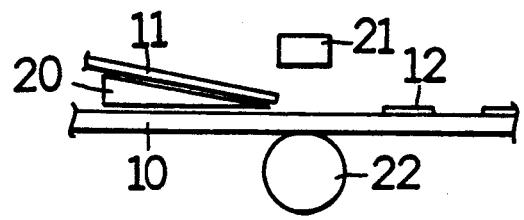
Figure 6C:
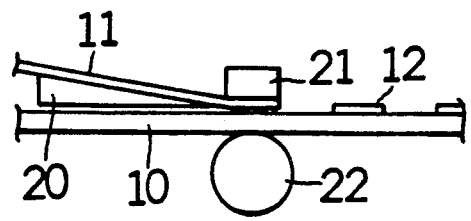
Figure 6D:
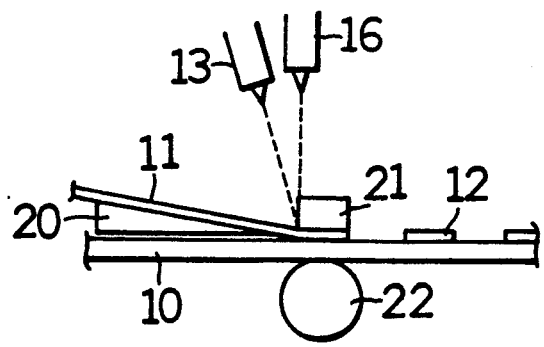
Figure 6E:
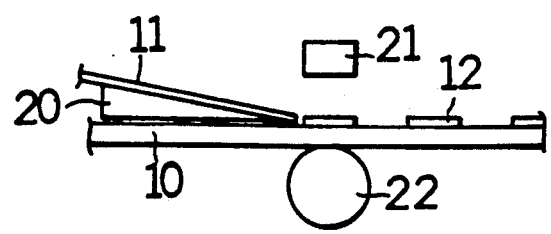

The laser-cutting device (16) has a laser-irradiating means held above the substrate material (10), as shown in FIG. 6d, and it has a function of cutting the metal foil (11) in the widthwise direction thereof at the edge of the presser tool (21).

The laser-welding device has a constitution of irradiating a laser beam from the laser-irradiating means to the direction of the laser-irradiating window as provided in the presser tool (21), simultaneously with laser-cutting, as shown in FIG. 6d.

Precisely, the process comprises the following steps.

(I) The metal foil (11) having ed width is fed in a determined amount to the cutting device, by the use of a constant-feeding device having a detachable means. (FIG. 6c is referred to.)

(II) When the metal foil (11) of a determined length has overhung from the edge of the guide (20), the presser tool (21) is moved downwards to press the metal foil (11), which is then cut by laser-cutting to give a metal foil piece (12). (FIG. 6d is referred to.)

(III) Simultaneously with the previous laser-cutting, the metal foil piece (12) is laser-welded by irradiating a laser beam thereto while the piece (12) is pressed to the substrate material (10). (FIG. 6d is referred to.) In the step, it is recommended that the position to be welded is one or more points in the widthwide direction of the substrate material.

(IV) After completion of the laser-welding, the metal-tacked substrate material (10) is then fed to the next step by means of the constant-feeding device in a determined amount, which is to be decided in consideration of the amount variable by the subsequent pressure-welding, rolling and finish-rolling.

For instance, a cycle of first effecting the steps (I) and (IV) simultaneously and then effecting the steps (II) and (III) is repeated, to thereby obtain the substrate material (10) on which the metal foil pieces (12) have been continuously tacked at a determined pitch.

The thus obtained substrate material (10) on which the metal foil pieces (12) have been tacked is then pressure-welded and rolled in the same way as in Example 1, whereby a spotwise partial clad material having metal foil pieces as clad at a highly accurate pitch is obtained.

For instance, a 42Ni-Fe material having a width of 42 mm and a thickness of 0.25 mm, to which Al foil pieces each having a width of 10 mm, a thickness of 10 microns and a length of 6.4 mm have been continuously tacked at a pitch of 36.0 mm is rolled whereupon the intended thickness of the rolled substrate is 0.15 mm and the intended pitch of the rolled Al foil pieces is 60.0 mm.

In rolling the said sample by the use of the rolling machine shown in FIG. 4, the back-up rolls are periodically defected and the rolling pressure fluctuates according to the rolling condition. Because of such variations, the variable width of the pitch of the metal foil pieces is about plus/minus 800 microns.

Where the intended pitch accuracy is to fall within the range of plus/minus 100 microns to plus/minus 300 microns under the condition of the above-mentioned tacking accuracy of plus/minus 30 microns at 0.25 t, or of plus/minus 50 microns at 0.15 t, it is necessary that the accuracy of controlling the rolled thickness is to fall within the level of a submicron order for attaining the pitch accuracy of being within the range of plus/minus 300 microns. In view of the values, therefore, it is considered difficult to effect the pitch control by mere control of the rolled thickness of the substrate material.

Regarding the influence of the deflection of the rolls to the thickness of the substrate material, where the variation of the load by the kiss rolls is plus/minus 0.5 ton, the gap variation is to be plus/minus 2 microns at a mill constant of 74 ton/mm, and accordingly, the variation of the thickness of the rolled material is to be about a half of the gap variation, or its corresponds to plus/minus 1 micron. Where the variation of the thickness of the rolled material is plus/minus 1 micron, the variation of the elongation thereof is to be plus/minus 600 microns.

Then, the above-mentioned Al-tacked sample was rolled by means of the controlling method of the present invention by the use of the rolling machine shown in FIG. 4, whereupon cascade control system of load-constant control and elongation percentage-constant control is employed along with feedback connection system for feeding the results obtained by measuring the position of the metal foil pieces by the use of a position-measuring device back to the rolling load-controlling device. As a result, Al foil pieces having a width of 10 mm and a length of 10.7 mm were clad on the substrate material having a width of 42 mm and a thickness of 0.15 mm. From the data, the controlling method of the present invention was compared with the rolling load control-free method, and it was found that the absolute position accuracy of the metal foil pieces as clad on the substrate material increased ten times or more in the controlling method of the present invention. Accordingly, the method of the invention gave a spotwise partial clad material having Al foil pieces as spotwise clad with high accuracy, which is most suitable as a lead frame material.

EXAMPLE 3

Figure 7A:
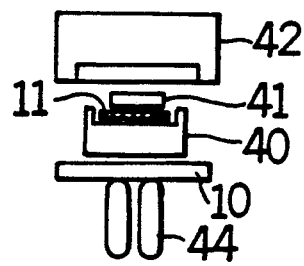
FIGS. 7a to 7e are schematic views of one embodiment of a constant-feeding and resistance-welding device, and these indicate a flow line of the method of the present invention.
Figure 7B:
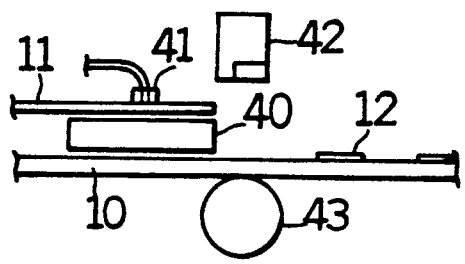
Figure 7C:
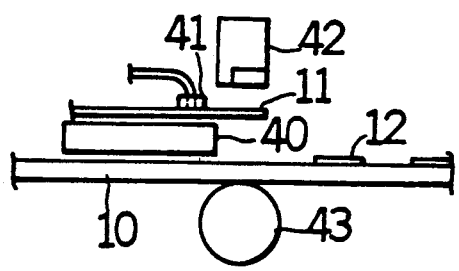
Figure 7D:
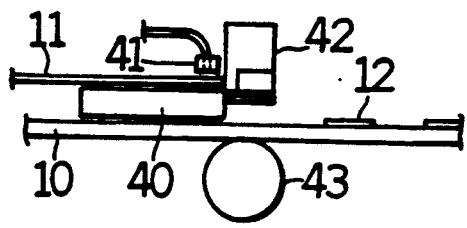
Figure 7E:
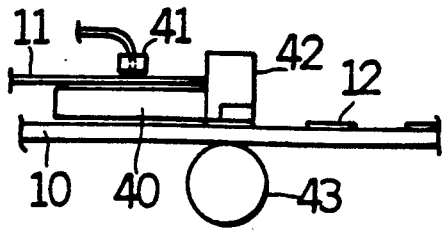
Figure 8:
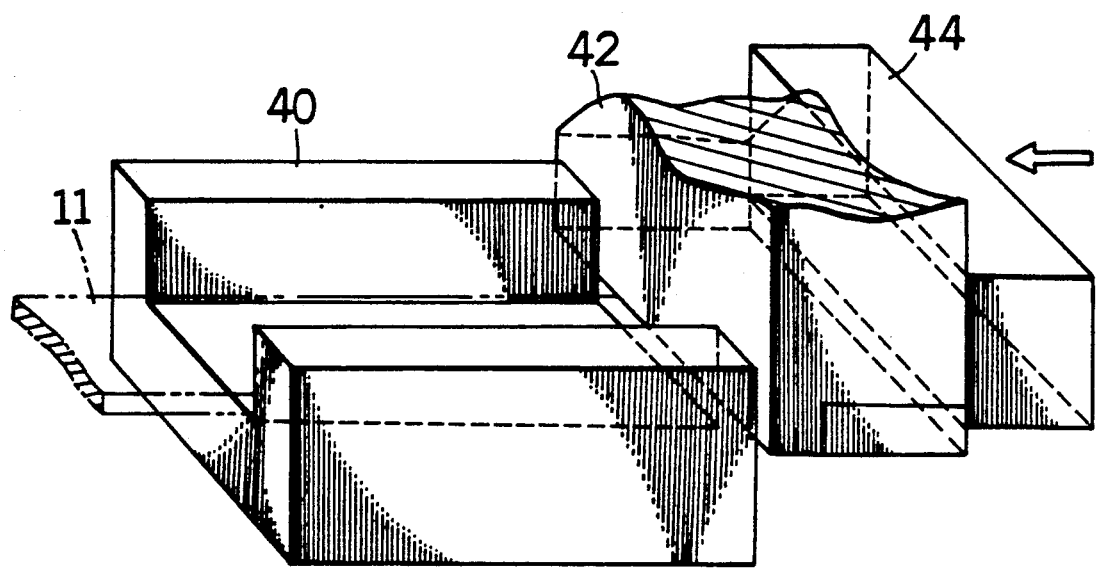
FIG. 8 is a perspective explanatory view showing the mechanism of sandwich-cutting to be effected in accordance with the present invention.

This is to illustrate a process of obtaining a metal-tacked material to be rolled by series spot-welding, with reference to FIGS. 7 and 8.

The substrate material (10) as unwound from a coil is fed out to a series spot-welding device by a determined length by the use of a constant-feeding device (not shown); a constant-feeding device of feeding the metal foil (11) by a determined length, which is provided with a detachable mechanism capable of attaching and detaching the metal foil (11), and a punch-cutting device are provided in the vicinity of the welding device; and the metal-tacked substrate material is coiled up after welding, or alternatively, it is pressure-welded and rolled in a rolling device which is provided in the further downstream of the flow line.

Precisely, in the constant-feeding device of feeding the metal foil (11) at a constant rate, the metal foil strip (11) having a determined width is adsorbed to the adsorbing device (41), and the thus adsorbed metal foil (11) is fed out by one stroke of the adsorbing device (41) by sliding over the inner bottom surface of the groove as formed on the material guide (40).

Although the constant-feeding device for feeding the substrate material (10) at a constant rate is not shown, any and every known device which may feed the material (10) by a determined length at a constant rate may be employed.

The punch-cutting device is shown in FIG. 8; where the downstream side of the above-mentioned material guide (40) is to be a bottom-fixing die, and the metal foil is cut as being punched between the punch (42) which is upwards and downwards by the action of an oil-pressure cylinder or a servomotor and the edge of the above-mentioned die.

In using the punch-cutting device for cutting the metal foil, the punch is pressed by a spring or the like via the punch holder (40) so that the gap clearance between the punch and the edge of the die is to be 0 (zero). Therefore, the device has an advantageous merit that it hardly clogs.

In the series spot-welding device, a roller electrode (43) is applied to the back surface of the substrate material (10) at the position to which the metal foil piece (12) be welded, or that is, it is applied to the center part of the back surface of the material (10), and the roller electrode (43) is combined with the above-mentioned punch (42) which is equipped with an electroconductive material. Accordingly, after the metal foil has been cut by punching with the punch-cutting device, an electric current is applied to the punch (42) and the metal foil piece when they are brought into contact with the substrate material (10) whereby the metal foil piece is spot-welded on the substrate material.

Precisely, the process comprises the following steps.

(I) The metal foil (11) having a determined width is fed into the cutting device in a determined length, by means of the constant-feeding device having a detachable mechanism to act by suction, whereupon the determined length of the foil (11) to be fed is to be decided in consideration of the variable amount to be varied by the successive pressure-welding, rolling and finish-rolling. (FIG. 7c is referred to.)

(II) When the metal foil (11) having a determined length has overhung from the edge of the guide (40), the punch (42) is moved downwards to cut the metal foil (11) to give a metal foil piece (12). (FIG. 7d is referred to.)

(III) At the time when the metal foil piece (12) as cut with the punch (42) is applied to the substrate material (10) under pressure, the roller electrode (43) is pressed with imparting an electric current thereto, whereby the metal foil piece (12) is welded to the substrate material (10). (FIG. 7e is referred to.)

Figure 1:
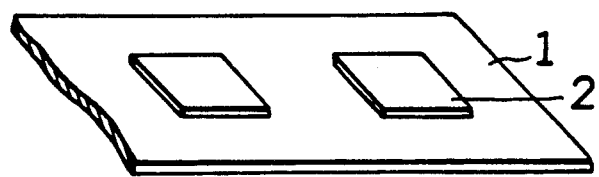
FIG. 1 is a perspective explanatory view of a spotwise partial clad material.

In the step, it is desired that the metal foil piece (12) is welded in such a degree that the molten part of the metal piece does not appear to the surface of the welded metal foil piece (12) and it is recommended that the piece (12) is spot-welded in the widthwise direction of the substrate material (10) at one or more points In particular, spot-welding of the metal foil piece (12) at two points in the both edges of the piece (12) in the widthwise direction of the substrate material (10) is preferred, as shown in FIG. 1a, and only the leading edge which is to be put between rolls in the subsequent rolling step is tacked while the opposite trailing edge is left free, whereby the pressure-weldability and the rolling workability are improved.

(IV) After completion of the spot-welding, the metal-tacked substrate material (10) is then fed to the next step by means of the constant-feeding device in a determined amount, which is to be decided in consideration of the amount variable by the subsequent pressure-welding, rolling and finish-rolling.

The above-mentioned steps are repeated, whereby the metal foil pieces (12) as cut in a determined size are spot-welded on the substrate material (10) at determined intervals.

For instance, a cycle of first effecting the steps (I) and (IV) simultaneously and then effecting the steps (II) and (III) is repeated.

(V) Next, the thus-obtained substrate material (10) on which the metal foil pieces (12) have been tacked at a determined pitch is then pressure-welded and rolled.

The pressure-welding and rolling step was carried out in accordance with a cascade control system for load-constant control and elongation percentage-constant control, as combined with a feedback control system based on the result of the measurement of the pitch by the use of the pitch-measuring device as provided at the outlet of the rolling machine.

In the case, where the position of the pitch-measuring device is arranged separately from the rolling machine by, for example, 20 to 30 pitches or so, the distance of 20 to 30 pitches is to cause a measuring lag by the distance of itself. Accordingly, it has been found that the value of the measuring lag is related to the presumed accuracy of the pitch as presumed from the rolling pressure function $Q_P$ obtained from the from the relationship between the rolling load and the pitch and, as a result, accumulation of the errors is to have an influence on the result of the accumulated pitch control.

Then, it has been found that the accumulated pitch control may be improved by making the position of the pitch-measuring device approach the rolling machine as near as possible. For instance, it has been confirmed that when the pitch-measuring lag is decreased from 680 mm to 125 mm, then the error of about plus/minus 2 mm may be reduced to about plus/minus 0.5 mm.

However, some pitch-measuring devices of a certain type are difficult to approach the rolling machine. In the present case, therefore, the pitch immediately after rolling is presumed from the rolling load and accordingly the measuring lag is compensated.

Precisely, as the pitch at the outlet of the rolling machine may be presumed from the rolling load and the rolling pressure function, the rolling pressure function is obtained from the actual load and the actual pitch and the pitch at the outlet is presumed from the newest rolling pressure function, whereby the loss time compensation to result from the pitch-measuring lag is controlled. As the accumulation of the presumed error is to be represented by the lag from the actual accumulated pitch, accumulation of the presumed errors is made to be the aimed control of the accumulated pitch so that the lag of the accumulated pitch may be reduced.

Figure 13:
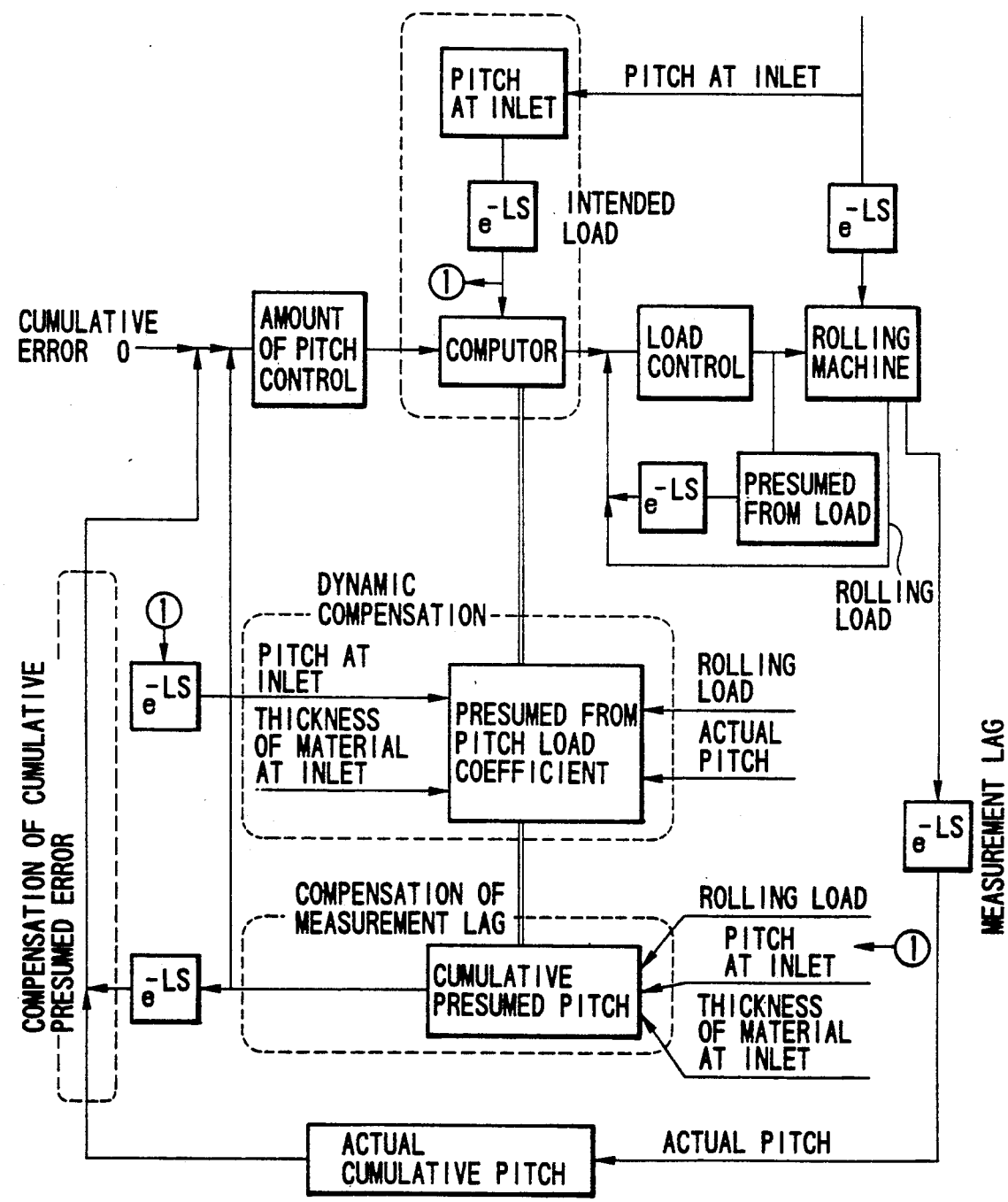
FIG. 13 is a flow chart showing the process for pitch control to be effected during rolling in accordance with the present invention.

More precisely, as shown in FIG. 13, pitch control is effected in accordance with the following flow line.

(1) A rolling pressure function is obtained from the actually measured pitch, the pitch at the inlet of the rolling machine, the load value and the constant value (roll diameter, deformation resistance and others);

(2) pitch is presumed from the actual value of the load (interval mean value), the pitch at the inlet of the rolling machine and the rolling pressure function;

(3) the presumed error (accumulated actual value - o accumulated presumed value) is made to be the aimed control for effecting the accumulated pitch control;

(4) the operation pitch is converted to the operation load, on the basis of the newest rolling pressure function; and (5) the intended rolling load is obtained from the result of the inlet side pitch as measured.

For instance, the above-mentioned control was effected under the condition mentioned below and, as a result, the same effect as the case where the pitch-measured lag was reduced from 680 mm to 125 mm was obtained.

$Q_P = 1.555$, $P = 12780$ kg, $k_m = 75$ kg/mm², $R = 40$ mm, $L_1 = 18.684$ mm,
$L_O = 27.400$ mm, $b = 49.85$ mm, $h_1 = 0.368$ mm.

As mentioned above in detail, a spotwise partial clad material having metal foil pieces as spotwise clad at a highly accurate pitch was obtained by the rolling-control method of the present invention.

EXAMPLE 4

This is to illustrate another embodiment of a process of obtaining a metal-tacked material to be rolled by series spot-welding, with reference to FIG. 9.

The substrate material (10) as unwound from a coil is fed out to a series spot-welding device (45) by a determined length by the use of a constant-feeding device (not shown); while the metal foil (11) is also fed out onto the material (10) by a determined length by the use of a constant-feeding device (not shown). A cutting device composed of a pair of circular cutters (48)(48) is provided in the downstream of the series spot-welding device (45), and the metal-tacked substrate material is coiled up after welding, or alternatively, it is pressure-welded and rolled in a rolling device which is provided in the further downstream of the flow line.

Although the constant-feeding devices of feeding the substrate material (10) and the metal foil (11) at a constant rate are not shown, any known devices which may feed them at a constant rate may be employed.

Figure 9A:
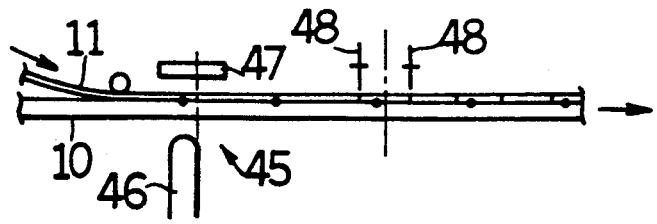
FIGS. 9a, 9b, 9d and 9f are schematic views of the flow line of the method of the present invention.
Figure 9B:
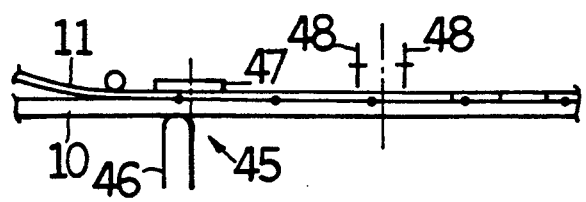
Figure 9C:
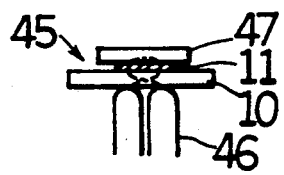
FIGS. 9c and 9e are schematic views of a resistance-welding device and a cutter, respectively, from the direction of the flow line.

In the series spot-welding device, an electrode (46) is applied to the back surface of the substrate material (10) at the position to which the metal foil (11) is to be welded, or that is, it is applied to the center part of the back surface of the material (10), as shown in FIG. 9c; and an electroconductive material part (47) is arranged in the side of the metal foil (11).

Precisely, the electrode (46) and the electroconductive material part (47) may be opened and shut in accordance with the function of the feeding device having a guide mechanism for guiding the metal foil to the determined position along the substrate material (10). After the substrate material (10) and the metal foil (11) have been fed to the determined position at a constant feeding rate and the latter has been put on the former, the electrode (46) and the electroconductive material part (47) are moved to be brought into contact with the substrate material (10) and the metal foil (11), whereupon an electric current is imparted to the electrode (46) and the part (47) to effect spot-welding of the foil (11) to the material (10).

Figure 9D:
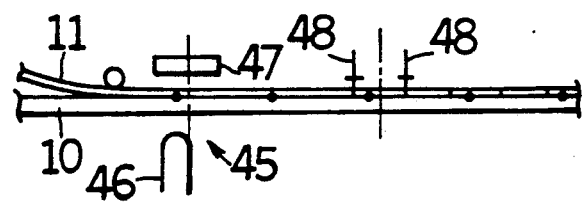
Figure 9E:
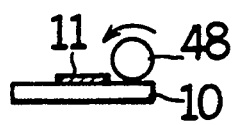

The process uses a cutting device as shown in FIG. 9e. The cutting device is composed of a pair of circular cutters (48)(48) arranged with a determined interval therebetween, which are rotated by means of a driving motor (not shown). Accordingly, the metal foil (11) as moved to the cutting device is cut therewith in the widthwise direction of the same.

Precisely, the process comprises the following steps.

(I) The metal foil (11) is fed onto the substrate material (10) at a determined position according to the guide mechanism, and both the substrate material (10) and the metal foil (11) are fed into the series spot-welding device (45) having an electrode which may be opened and shut according to the above-mentioned means. In the step, the determined amounts of the material (10) and the foil (11) to be fed need to be decided in consideration of the variable amount to be varied by the successive pressure-welding, rolling and finish-rolling. (FIG. 9a is referred to.)

(II) At the point when the electrode (46) has been moved upwards and the welding electroconductive material part (47) has been applied to the metal foil (11) under pressure so as to press the foil (11) to the substrate material (10), an electric current is imparted to the electrode (46) whereby the metal foil is welded to the substrate material (FIGS. 9b and 9c are referred to.)

In the step, it is desired that the metal foil be welded in such a degree that the molten part of the metal foil does not appear to the surface of the welded metal foil and it is recommended that the foil be spot-welded in the widthwise direction of the substrate material (10) at one or more points.

In particular, spot-welding of the metal foil piece (11) at two or more points in the both edges of the piece (11) in the widthwise direction of the substrate material (10) is preferred, as shown in FIG. 9c, and only the leading edge which is to be put between rolls in the subsequent rolling step is tacked while the trailing edge is left free, thereby improving the pressure-rolling workability.

(III) The metal foil (11)as fixed on a part of the substrate material (10) at the position separated from the above-mentioned welding device by integer times of the determined pitch is cut with the circular cutters (48)(48) as arranged with a determined interval therebetween into a determined length to shape the metal foil piece (11). (FIGS. 9d and 9e are referred to.)

In the step, the length to be cut is to be determined in consideration of the amount to be variable by the following pressure-welding, rolling and finish-rolling.

Figure 9F:
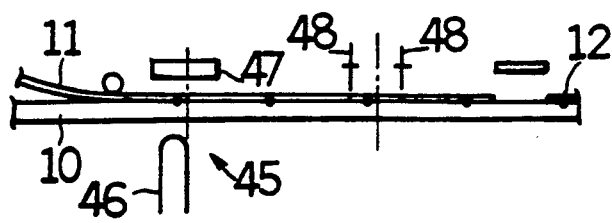

(IV) After being cut, the part not welded is removed, whereby the metal foil piece (12) which has been tacked by spot-welding and which has a good shape and a determined size is obtained. (FIG. 9f is referred to.)

For instance, a cycle of first effecting the step (I) and then simultaneously effecting the steps (II), (III) and (IV) is repeated.

(V) Next, the thus obtained substrate material (10) on which the metal foil pieces (12) have been tacked at a determined pitch is then pressure-welded and rolled in the same manner as in Example 1, whereby a spotwise partial clad material having metal foil pieces as spotwise clad at a highly accurate pitch is obtained.

EXAMPLE 5

This illustrates a process of obtaining a metal-tacked material to be rolled by ultrasonic spot-welding, with reference to FIG. 10.

The substrate material (10) as unwound from a foil is fed out to an ultrasonic welding device (50) by a determined length by the use of a constant-feeding device (not shown); while the metal foil (11) is also fed out onto the material (10) by a determined length by the use of a constant-feeding device (not shown).

A cutting device composed of a pair of circular cutters (53)(53) is provided in the side of the downstream below the ultrasonic welding device (50); and the metal-tacked substrate material is coiled up after welding, or alternatively, it is pressure-welded and rolled in a rolling device which is provided in the further downstream of the flow line.

Although the constant-feeding devices for feeding the substrate material (10) and the metal foil (11) at a constant rate are not shown, any known devices which may feed them at a constant rate may be employed.

Figure 10A:
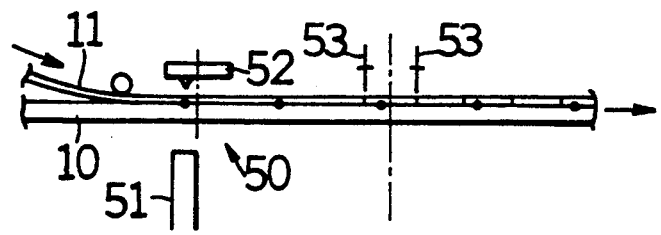
FIGS. 10a, 10b, 10d and 10f are schematic views of the flow line of manufacturing a metal-tacked material to be rolled.
Figure 10B:
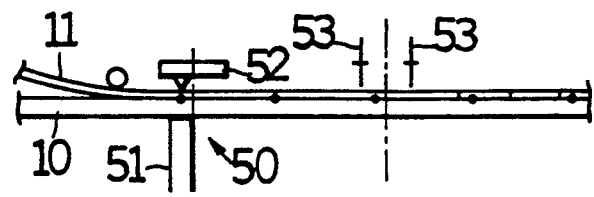
Figure 10C:
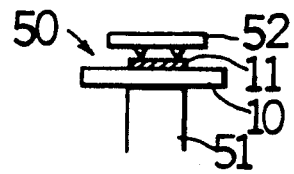
FIGS. 10c and 10e are schematic views of an ultrasonic-welding device and a cutter, respectively, from the direction of the flow line.

The ultrasonic welding device is shown in FIG. 10c, where a supporting part (51) which is movable upwards and downwards is applied to the back surface of the substrate material (10) at the position to which the metal foil (11) is to be welded, or that is, it is applied to the center part of the back surface of the material (10), and an ultrasonic waves-donating plate (52) is applied to the metal foil (11).

Precisely, the supporting part (51) and the ultrasonic waves-donating plate (52) may be opened and shut in accordance with the function of the feeding device having a guide mechanism of guiding the metal foil to the determined position along the substrate material (10). After the substrate material (10) and the metal foil (11) have been fed to the determined position at a constant feeding rate and the latter has been put on the former, the supporting part (51) and the ultrasonic waves-donating plate (52) are moved to be brought into contact with the substrate material (10) and the metal foil (11), whereupon ultrasonic waves are imparted to the metal foil (11) so that the foil (11) is ultrasonically welded to the substrate material (10).

Figure 10D:
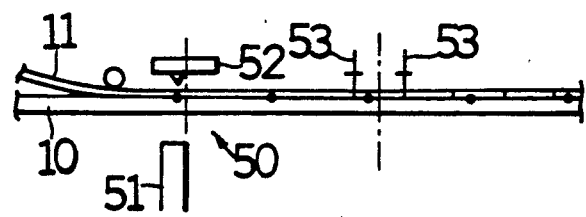
Figure 10E:
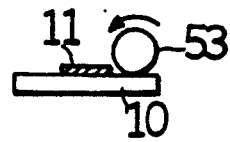

The process uses a cutting device as shown in FIG. 10e. The cutting device is composed of a pair of circular cutters (53)(53) as arranged with a determined interval therebetween, which are rotated by means of a driving moter (not shown). Accordingly, the metal foil (11) as moved to the cutting device is cut therewith in the widthwise direction of the same.

Precisely, the process comprises the following steps, and it will be explained in detail with reference to FIGS. 10a to 10f.

(I) The metal foil (11) is fed onto the substrate material (10) at a determined position according to the guide mechanism, and both the substrate material (10) and the metal foil (11) are fed into the ultrasonic welding device (50) where the supporting part may be moved upwards and downwards in accordance with the above-mentioned means. In the step, the amounts of the material (10) and the foil (11) to be fed need to be decided in consideration of the variable amounts to be varied by the successive pressure-welding, rolling and finish-rolling. (FIG. 10a is referred to.)

(II) At the point when the supporting part (51) has been moved upwards and the ultrasonic waves-donating plate (52) has been applied to the metal foil (11) under pressure so as to press the foil (11) to the substrate material (10), the metal foil is welded to the substrate material under pressure by the action of the ultrasonic waves generated from the plate (52). (FIGS. 10b and 10c are referred to.)

In particular, welding of the metal foil piece (11) at two points in the both edges of the piece (11) in the widthwise direction of the substrate material (10) is preferred, as shown in FIG. 10c, and only the top edge side which is to be put between rolls in the subsequent rolling step is tacked while the opposite bottom edge side is left free, whereby the pressure-weldability and the rolling workability are improved.

(III) The metal foil (11) as fixed on a part of the substrate material (10) at the position separated from the above-mentioned welding device by integer times of the determined pitch is cut with the circular cutters (53)(53) as arranged with a determined interval therebetween into a determined length to shape the metal foil piece (11). (FIGS. 10d and 10e are referred to.)

In the step, the length to be cut is to be determined in consideration of the amount to be variable by the following pressure-welding, rolling and finish-rolling.

Figure 10F:
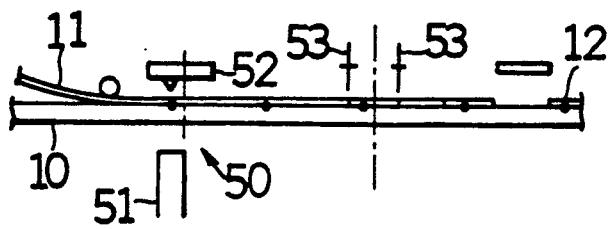

(IV) After being cut, the part not welded is removed, whereby the metal foil (12) which has been tacked by ultrasonic welding and which has a good shape and a determined size is obtained. (FIG. 10f is referred to.)

For instance, a cycle of first effecting the step (I) and then simultaneously effecting the steps (II), (III) and (IV) is repeated, and the thus obtained substrate material (10) on which the metal foil pieces (12) have been tacked at a determined pitch is then pressure-welded and rolled in the same manner as in Example 1. Accordingly, a spotwise partial clad material having metal foil pieces as spotwise clad at a highly accurate pitch is obtained.

In carrying out the process of the invention, any known means and apparatus may be employed for the ultrasonic welding. For instance, a high frequency oscillator may be used, where the oscillating element is oscillated with ultrasonic waves of 15 to 16 kHz. An ultrasonic waves-donating plate is attached to the metal foil and the substrate material as welded to each other in the direction of the welded thickness under pressure of about 10 N, and the oscillating element is applied to the ultrasonic waves-donating plate in the direction perpendicular to the plate, or that is, in the direction parallel to the welded surface. Under the condition, the metal foil is ultrasonically welded to the substrate material for 0.1 to one second.

EXAMPLE 6

This illustrate a process of forming a metal-tacked material to be rolled, by laser spot-welding, with reference to FIG. 11. In the process, cutting is effected by the use of circular cutters.

The substrate material (10) as unwound from a coil is fed out to a laser-welding device (60) by a determined length by the use of a constant-feeding device (not shown); while the metal foil (11) is also fed onto the material (10) by a determined length by the use of a constant-feeding device (not shown).

A cutting device composed of a pair of circular cutters (63)(63) is provided in the side of the downstream below the laser-welding device (60); and the metal-tacked substrate material is coiled up after welding, or alternatively, it is pressure-welded and rolled in a rolling device which is provided in the further downstream of the flow line.

Although the constant-feeding devices of feeding the substrate material (10) and the metal foil (11) at a constant feeding rate are not shown, any known devices which may feed them at a constant rate may be employed.

Figure 11A:
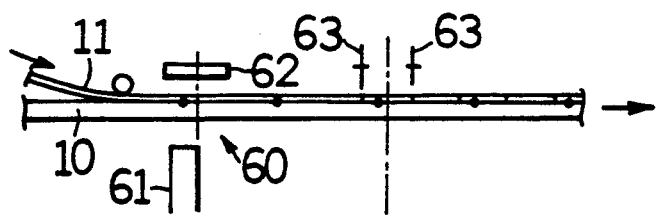
FIGS. 11a, 11b, 11d and 11f are schematic views of the flow line of manufacturing a metal-tacked material to be rolled.
Figure 11B:
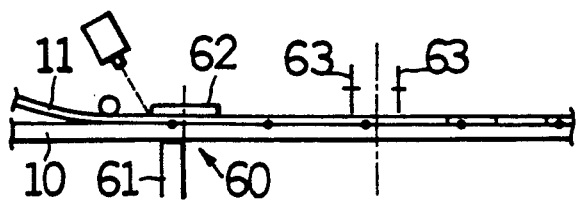
Figure 11C:
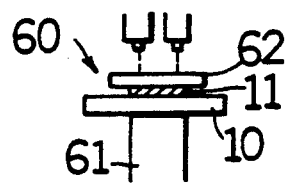
FIGS. 11c and 11e are schematic views of a laser-welding device and a cutter, respectively, from the direction of the flow line.

The laser-welding device is shown in FIGS. 11b and 11c, where a supporting part (61) which is movable upwards and downwards is applied to the back surface of the substrate material (10) at the position to which the metal foil (11) is to be welded, or that is, it is applied to the center part of the back surface of the material (10), and a presser tool (62) is applied to the metal foil (11).

Precisely, the supporting part (61) and the presser tool (62) may be opened and shut in accordance with the function of the feeding device having a guide mechanism of guiding the metal foil to the determined position along the substrate material (10). After the substrate material (10) and the metal foil (11) have been fed to the determined position at a constant feeding rate and the latter has been put on the former, the supporting part (61) and the presser tool (62) are moved to be brought into contact with the substrate material (10) and the metal foil (11), whereupon laser rays are irradiated to the metal foil (11) so that the foil is laser-welded to the material (10).

Figure 11D:
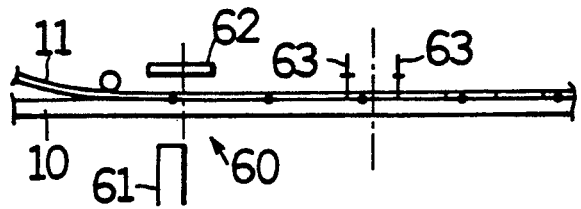
Figure 11E:
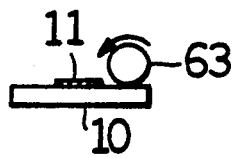

The process used a cutting device as shown in FIG. 11e. The cutting device is composed of a pair of circular cutters (63)(63) as arranged with a determined interval therebetween, which are rotated by means of a driving moter (not shown). Accordingly, the metal foil (11) as moved to the cutting device is cut therewith in the widthwide direction of the same.

Precisely, the process comprises the following steps.

(I) The metal foil (11) is fed onto the substrate material (10) at a determined, position according to the guide mechanism, and both the substrate material (10) and the metal foil (11) are fed into the laser-welding device (60) where the supporting part may be moved upwards and downwards in accordance with the above-mentioned means. In the step, the determined amounts of the material and the foil (11) to be fed need to be decided in consideration of the variable amount to be varied by the successive pressure-welding, rolling and finish-rolling. (FIG. 11a is referred to.)

(II) At the point when the supporting part (61) has been moved upwards and the presser tool (62) has been applied to the metal foil (11) under pressure so as to press the foil (11) to the substrate material (10), a laser beam is irradiated from the laser-welding device (60) on the metal foil through an irradiating window in the presser tool (62) whereby the thus irradiated metal foil is welded to the substrate material. (FIGS. 11b and 11c are referred to.)

The step is advantageous, since the laser-irradiating time is extremely short and the metal is melted little. Additionally, the surface of the welded metal foil hardly has welded stains. It is recommended that the metal foil be welded to the substrate material at one or more points in the widthwise direction of the substrate material (10).

In particular, welding of the metal foil piece (11) at two points in the both edges of the piece (11) in the widthwise direction of the substrate material (10) is preferred, as shown in FIG. 11c, and only the leading edge which is to be put between rolls in the subsequent rolling step is tacked while the trailing edge is left free, whereby the pressure-weldability and the rolling workability are improved.

(III) The metal foil (11) as fixed on a part of the substrate material (10) at the position separated from the above-mentioned welding device by integer times the determined pitch is cut with the circular cutters (63)(63) arranged with a determined interval therebetween into a determined length to shape the metal foil piece (11). (FIGS. 11d and 11e are referred to.)

In the step, the length to be cut is to be determined in consideration of an amount to be variable by the following pressure-welding, rolling and finish-rolling.

Figure 11F:
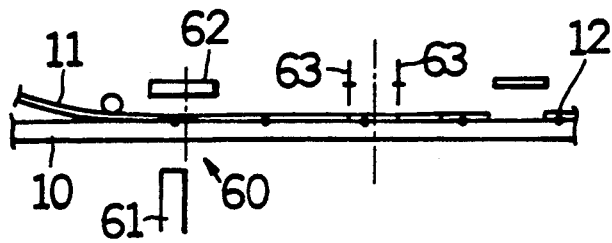

(IV) After being cut, the part not welded is removed, whereby the metal foil piece (12) which has been tacked by laser-welding and which has a good shape and a determined size is obtained. (FIG. 11f is referred to.)

For instance, a cycle of first effecting the step (I) and then simultaneously effecting the steps (II), (III) and (IV) is repeated, and the thus-obtained substrate material (10) on which the metal foil pieces (12) have been tacked at a determined pitch is then pressure-welded and rolled in the same manner as in Example 1. Accordingly, a spotwise partial clad material having metal foil pieces as spotwise clad at a highly accurate- pitch is obtained.

EXAMPLE 7

This is to illustrate a process of forming a metal-tacked material to be rolled, by laser spot-welding, with reference to FIG. 12. In the process, cutting is effected by the use of a punch-cutter.

The substrate material (10) as unwound from a coil is fed out to a laser-welding device by a determined length by the use of a constant-feeding device (not shown); a constant-feeding device for feeding the metal foil (11) by a determined length, which is provided with a detachable mechanism capable of attaching and detaching the metal foil (11), and a punch-cutting device are provided in the vicinity of the welding device; and the metal-tacked substrate material is coiled up after welding, or alternatively, it is pressure-welded and rolled in a rolling device which is provided further downstream of the flow line.

Precisely, in the constant-feeding device of feeding the metal foil (11) at a constant rate, the metal foil strip (11) having a determined width is adsorbed to the adsorbing device (71), and the thus adsorbed metal foil (11) is fed out by one stroke of the adsorbing device (71) by sliding over the inner bottom surface of the groove as formed on the material guide (70).

Although the constant-feeding device for feeding the substrate material (10) at a constant feeding rate is not shown, any and every known device which may feed the material (10) by a determined length at a constant rate may be employed.

Figure 12A:
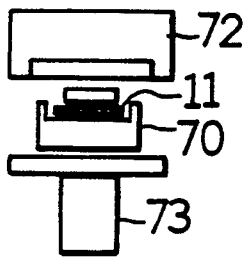
FIGS. 12a to 12e are schematic views of one embodiment of a constant-feeding and sandwich-cutting device and a laser-welding device, and these indicate a flow line of manufacturing a metal-tacked material to be rolled, FIG. 12a being an explanatory view as seen from the direction of the flow line.
Figure 12B:
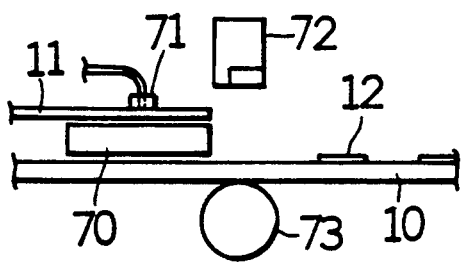

The punch-cutting device is shown in FIGS. 12a and 12b; where the downstream side of the above-mentioned material guide (70) is to be a bottom-fixing die, and the metal foil is cut as being punched between the punch (72) which is moved upwards and downwards by the action of an oil-pressure cylinder or a servomotor and the edge of the above-mentioned die.

In using the punch-cutting device for cutting the metal foil, the punch is pressed by a spring or the like via the punch holder so that the gap clearance between the punch and edge of the die is to be 0 (zero). Therefore, the device has an advantageous merit that is hardly clogs.

Figure 12C:
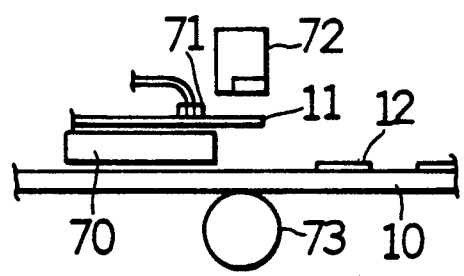
Figure 12D:
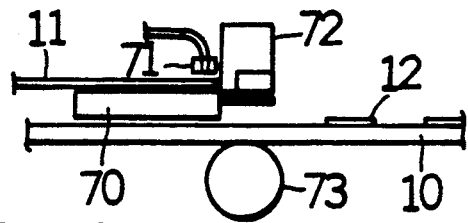
Figure 12E:
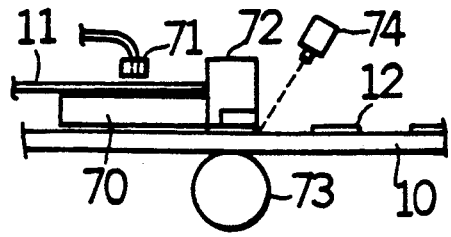

In the laser-welding device, a supporting roller (73) is applied to the back surface of the substrate material (10) at the position to which the metal foil (11) is to be welded, or that is, it is applied to the center part of the back surface of the material (10), and the supporting roller (73) is combined with the above-mentioned punch (72) as equipped with a laser-irradiating means. Accordingly, after the metal foil has been cut with the above-mentioned punch-cutting device, the metal foil piece thus cut is welded to the substrate material by laser-welding whereupon the punch (72) is brought into contact with the substrate material (10) along with the metal foil piece. Alternatively, as shown in FIG. 12e, a laser beam may be irradiated to the metal foil piece from the laser-irradiating means towards the laser-irradiating window as slitted in the side opposite to the cutter of the punch (72).

Precisely, the process comprises the following steps.

(I) The metal foil (11) having a determined width is fed into the cutting device in a determined length, by means of the constant-feeding device having a detachable mechanism to act by means of a suction device (71). (FIG. 12c is referred to.)

(II) When the metal foil (11) having a determined length has overhung from the edge of the guide (70), the punch (72) is moved downwards to cut the metal foil (11) to give a metal foil piece (12). (FIG. 12d is referred to.)

(III) At the point when the metal foil piece (12) as cut with the said punch (72) has been applied to the substrate material (10) under pressure, a laser beam is irradiated to the metal foil piece (12) so that the piece (12) is laser-welded to the substrate material (10). (FIG. 12e is referred to.) In the step, it is preferred that the welding condition is same as that employed in Example 6.

(IV) After completion of the laser-welding, the metal-tacked substrate material (10) is then fed to the next step by means of the constant-feeding device in a determined amount, which is to be decided in consideration of the amount variable by the subsequent pressure-welding, rolling and finish-rolling.

For instance, a cycle of effecting the steps (I) and (IV) at the same time and thereafter effecting the steps (II) and (III) is repeated, and the substrate material (10) to which the metal pieces (12) have been continuously tacked at a determined pitch is then pressure-welded and rolled in the same manner as in Example 1. As a result, a spotwise partial clad material having metal foils as spotwise clad at a highly accurate pitch is obtained.

INDUSTRIAL APPLICATION

According to the method of the present invention, a spotwise partial clad material which is most suitable to a lead frame for flat package is obtained, as the lead frame needs to be previously provided with metal-coated parts, for example, brazing material-coated parts, at determined positions for wire-bonding.

Figure 2:
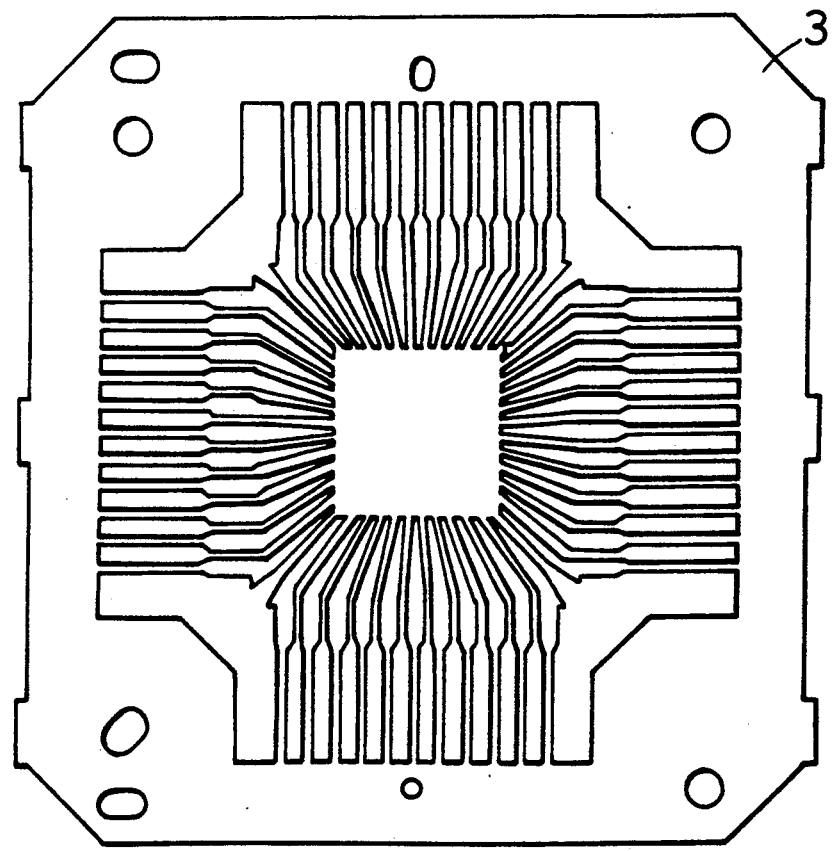
FIG. 2 is an explanatory view of one embodiment of a lead frame.

For instance, a spotwise partial clad material where Al foil pieces each having a predetermined size have been pressure-welded to a 42Ni-Fe substrate material at determined intervals can be obtained by the invention. Where a lead frame as shown in FIG. 2 is to be manufactured from the clad material by continuous press-shaping, the positions of the Al foil pieces are not shifted or the Al foilpieces themselves are not deformed during continuous press-shaping since the Al foil pieces have been well pressure-welded on the substrate material at a highly accurate pitch. Therefore, using the clad material of the present invention, the yield of lead frames is elevated and the producibility thereof from the clad material is improved.

We claim:

1. A process for producing a spot-clad strip member comprising the steps of:
providing a strip-like substrate and a plurality of metal foil pieces having a desired dimension and arranging said metal foil pieces on a surface of said substrate at a predetermined interspace by tacking each of said metal foil pieces at least one spot to the surface of said substrate to provide a metal blank;
pressure-rolling said metal blank at a rolling load, while determining a target rolling load depending on the dimensions of the strip-like substrate and the tacked metal foil pies and said interspace to obtain a target interspace and a target thickness of the pressure-rolled metal blank so as to adjust the rolling load to be constant on the basis of the target rolling load; and
correcting and controlling the rolling load in response to a difference between a target position and an actual position of the metal foil piece located at a desired position of a nth number counted from a starting position which was previously set on the metal blank, the difference being observed by an actual measurement of the position of the metal foil piece after pressure-rolling the metal blank.

2. The process of producing a spot-clad strip member according to claim 1, wherein a value to be determined for the target rolling load is adjusted by measurement of position from a predetermined position where the metal foil piece is located before pressure-rolling of the metal blank.

3. The process of producing a spot-clad strip member according to claim 1, wherein the metal blank-forming step includes a spot-resistance welding a metal foil strip which is fed at a constant rate to the strip-like substrate which is fed at a constant rate so as to tack the metal foil strip on the surface of strip-like substrate and simultaneously cutting the thus tacked metal foil strip by a punch, the pot-resistance welding being carried out by using the punch as a current carrying member.

4. The process of producing a spot-clad strip member according to claim 1, wherein the metal blank-forming step includes spot ultrasonic welding a metal foil strip which is fed at a constant rate to the strip-like substrate which is fed at a constant rate so as to tack the metal foil strip on the surface of the strip-like substrate and simultaneously cutting the thus tacked metal foil by a punch, the spot ultrasonic welding of which being carried out by an ultrasonic excitation means attached to the punch.

5. The process of producing a spot-clad strip member according to claim 1, wherein the metal blank-forming step includes spot laser welding a metal foil strip which is fed at a constant rate while pressing it by a pressing jig onto the strip-like substrate which is fed at a constant rate so as to tack the metal foil strip on the surface of the strip-like substrate and simultaneously cutting the thus-tacked metal foil strip by a laser beam.

6. The process of producing a spot-clad strip member according to claim 1, wherein the metal blank-forming step includes continuously spot resistance welding a metal foil strip which is fed at a constant rate to the strip-like substrate which is fed at a constant rate so as to tack the metal foil strip on the surface of the strip-like substrate and subsequently cutting the thus-tacked metal foil strip by a rotary cutter at predetermined interspaces in the lengthwise direction of the tacked metal foil strip to form a plurality of metal foil pieces having a desired dimension on the strip-like substrate.

7. The process of producing a spot-clad strip member according to claim 1, wherein the metal blank-forming step includes continuously spot ultrasonic welding a metal foil strip which is fed at a constant rate to the strip-like substrate which is fed at a constant rate so as to tack the metal foil strip on the surface of the strip-like substrate and subsequently cutting the thus-tacked metal foil strip by a rotary cutter at predetermined interspaces in the lengthwise direction of the tacked metal foil strip to form a plurality of metal foil pieces having a desired dimension on the strip-like substrate.

8. The process of producing a spot-clad strip member according to claim 1, wherein the metal blank-forming step includes continuously spot laser welding a metal foil strip which is fed at a constant rate to the strip-like substrate which is fed at a constant rate so as to tack the metal foil strip on the surface of the strip-like substrate and subsequently cutting the thus-tacked metal foil strip by a rotary cutter at predetermined interspaces in the lengthwise direction of the tacked metal foil strip to form a plurality of metal foil pieces having a desired dimension on the strip-like substrate.

9. The process of producing a spot-clad strip member according to claim 1, wherein the metal blank-forming step includes continuously spot laser welding a metal foil strip which is fed at a constant rate to the strip-like substrate which is fed at a constant rate so as to tack the metal foil strip on the surface of the strip-like substrate and subsequently cutting the thus-tacked metal foil strip by a laser beam at predetermined interspaces in the lengthwise direction of the tacked metal foil strip to form a plurality of metal foil pieces having a desired dimension on the strip-like substrate.

10. The process of producing a spot-clad strip member according to claim 1, wherein the strip-like substrate is made of a metal selected from the group consisting of Ni, Ni alloy, Cu and Cu alloy.

11. The process of producing a spot-clad strip member according to claim 1, wherein the metal foil pieces are made of a metal selected from the group consisting of Al, Al alloy, Cu and Cu alloy.

* * * * *